(12) United States Patent
Ishihara

(10) Patent No.: US 10,219,374 B2
(45) Date of Patent: Feb. 26, 2019

(54) PRINTED WIRING BOARD

(71) Applicant: IBIDEN CO., LTD., Ogaki (JP)

(72) Inventor: Teruyuki Ishihara, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 0 days.

(21) Appl. No.: 15/398,778

(22) Filed: Jan. 5, 2017

(65) Prior Publication Data

US 2017/0196084 A1   Jul. 6, 2017

(30) Foreign Application Priority Data

Jan. 5, 2016  (JP) ................................. 2016-000564

(51) Int. Cl.
  *H05K 1/11*   (2006.01)
  *H05K 1/14*   (2006.01)

(52) U.S. Cl.
  CPC ............ *H05K 1/115* (2013.01); *H05K 1/112* (2013.01); *H05K 1/11* (2013.01); *H05K 1/14* (2013.01); *H05K 2201/041* (2013.01); *H05K 2201/095* (2013.01); *H05K 2201/09509* (2013.01); *H05K 2201/09518* (2013.01); *H05K 2201/09827* (2013.01)

(58) Field of Classification Search
  CPC ..................... H05K 1/115; H05K 2201/09509
  See application file for complete search history.

(56) References Cited

U.S. PATENT DOCUMENTS

| 6,119,335 A * | 9/2000 | Park ................. H05K 3/0038 29/830 |
| 6,340,841 B2 * | 1/2002 | Iijima ............... H01L 23/49827 257/678 |
| 6,972,382 B2 * | 12/2005 | Zollo .................. H05K 3/4623 174/262 |
| 7,348,677 B2 * | 3/2008 | Larnerd ................ H05K 1/115 257/774 |
| 9,648,733 B2 * | 5/2017 | Li ....................... H05K 3/0032 |
| 2005/0041405 A1 * | 2/2005 | Kawagoe ............... H05K 1/115 361/783 |

FOREIGN PATENT DOCUMENTS

JP    2007-115954 A    5/2007

* cited by examiner

*Primary Examiner* — Ishwarbhai B Patel
(74) *Attorney, Agent, or Firm* — Oblon, McClelland, Maier & Neustadt, L.L.P.

(57) ABSTRACT

A printed wiring board includes a first insulating layer, a second conductor layer including first and second circuits, a second insulating layer covering the second conductor layer on the first insulating layer, a third conductor layer including first and second circuits, a third insulating layer covering the third conductor layer on the second insulating layer, a fourth conductor layer including first circuit, a second via conductor connecting the first circuits in the second and third conductor layers through the second insulating layer, and a first skip via conductor penetrating through the second circuit in the third conductor layer and connecting the second circuit in the second conductor layer and the first circuit in the fourth conductor layer through the second and third insulating layers. The second and third conductor layers are formed such that the second conductor layer has thickness t2 larger than thickness t3 of the third conductor layer.

20 Claims, 6 Drawing Sheets

PRINTED WIRING BOARD

CROSS-REFERENCE TO RELATED APPLICATIONS

The present application is based upon and claims the benefit of priority to Japanese Patent Application No. 2016-000564, filed Jan. 5, 2016, the entire contents of which are incorporated herein by reference.

BACKGROUND OF THE INVENTION

Field of the Invention

The present invention relates to a printed wiring board having a skip via conductor that penetrates multiple resin insulating layers.

Description of Background Art

Japanese Patent Laid-Open Publication No. 2007-115954 describes a multilayer printed wiring board that has a via that penetrates one insulating layer and a skip via that penetrates multiple insulating layers. The entire contents of this publication are incorporated herein by reference.

SUMMARY OF THE INVENTION

According to one aspect of the present invention, a printed wiring board includes a first resin insulating layer, a second conductor layer formed on the first resin insulating layer and including a first conductor circuit and a second conductor circuit, a second resin insulating layer formed on the first resin insulating layer such that the second resin insulating layer is covering the second conductor layer, a third conductor layer formed on the second resin insulating layer and including a first conductor circuit and a second conductor circuit, a third resin insulating layer formed on the second resin insulating layer such that the third resin insulating layer is covering the third conductor layer, a fourth conductor layer on the third resin insulating layer and including a first conductor circuit, a second via conductor formed through the second resin insulating layer such that the second via conductor is connecting the first conductor circuits in the second conductor layer and the third conductor layer, and a first skip via conductor formed through the second and third resin insulating layers such that the first skip via conductor penetrating through the second conductor circuit in the third conductor layer and connecting the second conductor circuit in the second conductor layer and the first conductor circuit in the fourth conductor layer. The second and third conductor layers are formed such that the second conductor layer has a thickness t2 which is larger than a thickness t3 of the third conductor layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1A:
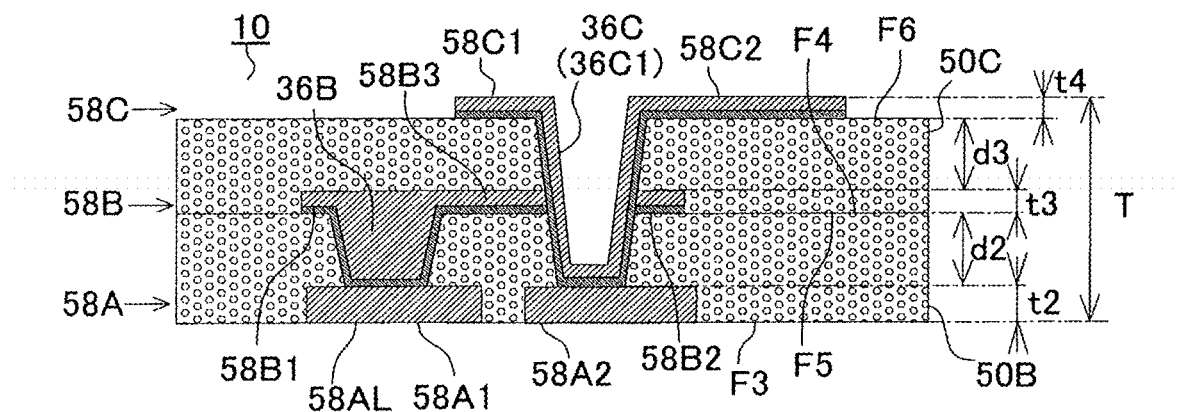
FIGS. 1A and 1B are cross-sectional views of a printed wiring board according to a first embodiment of the present invention.

The embodiments will now be described with reference to the accompanying drawings, wherein like reference numerals designate corresponding or identical elements throughout the various drawings.

First Embodiment

FIG. 1A illustrates a cross-sectional view of a printed wiring board 10 of a first embodiment.

As illustrated in FIG. 1A, the printed wiring board 10 includes a second conductor layer (58A), a second resin insulating layer (50B) on the second conductor layer (58A), a third conductor layer (58B) on the second resin insulating layer (50B), a third resin insulating layer (50C) on the second resin insulating layer (50B) and on the third conductor layer (58B), and a fourth conductor layer (58C) on the third resin insulating layer (50C).

The second resin insulating layer (50B) has a third surface (F3) and a fourth surface (F4) that is on an opposite side of the third surface (F3). The third resin insulating layer (50C) has a fifth surface (F5) that opposes the fourth surface (F4) and a sixth surface (F6) that is on an opposite side of the fifth surface (F5). In FIG. 1A, the third surface (F3) is exposed to the outside.

The second conductor layer (58A) is formed on the third surface (F3) of the second resin insulating layer (50B) and is embedded in the second resin insulating layer (50B). The second conductor layer (58A) has multiple conductor circuits including a first conductor circuit (58A1) in the second conductor layer (58A) and second conductor circuit (58A2) in the second conductor layer (58A). The first conductor circuit (58A1) in the second conductor layer (58A) and the second conductor circuit (58A2) in the second conductor layer (58A) are simultaneously formed. A lower surface (58AL) of the second conductor layer (58A) is exposed from the third surface (F3). The second resin insulating layer (50B) is formed between the conductor circuits in the second conductor layer (58A).

The third conductor layer (58B) is formed on the fourth surface (F4) of the second resin insulating layer (50B). The third conductor layer (58B) is formed on the fifth surface (F5) of the third resin insulating layer (50C) and is embedded in the third resin insulating layer (50C). The third conductor layer (58B) has a first conductor circuit (58B1) in the third conductor layer (58B), a second conductor circuit (58B2) in the third conductor layer (58B), and a third conductor circuit (58B3) in the third conductor layer (58B), the third conductor circuit (58B3) in the third conductor layer (58B) connecting the first conductor circuit (58B1) in the third conductor layer (58B) and the second conductor circuit (58B2) in the third conductor layer (58B). The first conductor circuit (58B1) in the third conductor layer (58B), the second conductor circuit (58B2) in the third conductor layer (58B), and the third conductor circuit (58B3) in the third conductor layer (58B) are simultaneously formed. These are integrally formed. It is also possible that the first conductor circuit (58B1) in the third conductor layer (58B) and the second conductor circuit (58B2) in the third conductor layer (58B) are directly connected to each other. In this case, the first conductor circuit (58B1) in the third conductor layer (58B) and the second conductor circuit (58B2) in the third conductor layer (58B) are simultaneously formed. These are integrally formed.

The fourth conductor layer (58C) is formed on the sixth surface (F6) of the third resin insulating layer (50C). The fourth conductor layer (58C) has a first conductor circuit (58C1) in the fourth conductor layer (58C). The fourth conductor layer (58C) may also have a second conductor circuit (58C2) in the fourth conductor layer (58C) extending from the first conductor circuit (58C1) in the fourth conductor layer (58C).

The conductor layers that are formed in different layers are connected by via conductors (36B, 36C) that penetrate the resin insulating layers (50B, 50C). The via conductor (36B) is a second via conductor (36B) that penetrates the second resin insulating layer (50B) and connects the second conductor layer (58A) and the third conductor layer (58B). In the first embodiment, the second via conductor (36B) penetrates only the second resin insulating layer (50B) and connects the first conductor circuit (58A1) in the second conductor layer (58A) and the first conductor circuit (58B1) in the third conductor layer (58B). The via conductor (36C) is a skip via conductor (36C) that penetrates multiple resin insulating layers. The skip via conductor (36C) in FIG. 1A is a first skip via conductor (36C1). The first skip via conductor (36C1) of the first embodiment penetrates the third resin insulating layer (50C), the second conductor circuit (58B2) in the third conductor layer (58B), and the second resin insulating layer (50B), and reaches the second conductor circuit (58A2) in the second conductor layer (58A). The first skip via conductor (36C1) connects the second conductor circuit (58A2) in the second conductor layer (58A) and the first conductor circuit (58C1) in the fourth conductor layer (58C). Due to the first skip via conductor (36C1), the second conductor circuit (58B2) in the third conductor layer (58B) and the first conductor circuit (58C1) in the fourth conductor layer (58C) are connected to each other. Due to the first skip via conductor (36C1), the second conductor circuit (58B2) in the third conductor layer (58B) and the second conductor circuit (58A2) in the second conductor layer (58C) are connected to each other.

As illustrated in FIG. 1A, the printed wiring board 10 does not have a via conductor that penetrates only the third resin insulating layer (50C) and reaches the third conductor layer (58B). The printed wiring board 10 does not have a via conductor that penetrates only the third resin insulating layer (50C) and connects the third conductor layer (58B) and the fourth conductor layer (58C).

The conductor layers (58A, 58B, 58C) respectively have thicknesses (t2, t3, t4). Examples of the thicknesses (t2, t3, t4) are illustrated below. The thickness (t2) of the second conductor layer (58A) is 3.5 μm or more and 6.5 μm or less. The thickness (t3) of the third conductor layer (58B) is 1 μm or more and 4 μm or less. The thickness (t4) of the fourth conductor layer (58C) is 1 μm or more and 4 μm or less. The thickness (t2) of the second conductor layer (58A) is larger than the thickness (t3) of the third conductor layer (58B). The thickness (t2) of the second conductor layer (58A) is larger than the thickness (t4) of the fourth conductor layer (58B). A ratio (t2/t3) of the thickness (t2) of the second conductor layer (58A) to the thickness (t3) of the third conductor layer (58B) is 1.5 or more and 2.5 or less. A ratio (t2/t4) of the thickness (t2) of the second conductor layer (58A) to the thickness (t4) of the fourth conductor layer (58B) is 1.5 or more and 2.5 or less.

The thickness (t3) of the third conductor layer (58B) and the thickness (t4) of the fourth conductor layer (58C) are substantially equal to each other. A ratio (t3/t4) is 0.9 or more and 1.1 or less.

For example, the thickness (t2) of the second conductor layer (58A) is 5 μm, the thickness (t3) of the third conductor layer (58B) is 2.5 μm, and the thickness (t4) of the fourth conductor layer (58C) is 2.5 μm.

The resin insulating layers (50B, 50C) respectively have thicknesses (d2, d3).

The thickness (d2) of the second resin insulating layer (50B) is 4 μm or more and 6 or less, and the thickness (d3) of the third resin insulating layer (50C) is 4 μm or more and 6 μm or less. As illustrated in FIG. 1A, each of the thicknesses (d2, d3) of the resin insulating layers (50B, 50C) is a distance between the conductor layers sandwiching the resin insulating layer. In the first embodiment, the thicknesses (d2, d3) are each 5 μm.

A thickness (T) of the printed wiring board 10 is a sum of the thicknesses (d2, d3) of the resin insulating layers (50B, 50C) and the thicknesses (t2, t3, t4) of the conductor layers (58A, 58B, 58C), and is about 20 μm.

The printed wiring board 10 of the present embodiment has the via conductor and the skip via conductor. The via conductor and the skip via conductor are formed in openings that penetrate the resin insulating layers. The opening for the via conductor and the opening for the skip via conductor are formed using laser. The via conductor is formed in the opening that penetrates only one resin insulating layer. The skip via conductor is formed in the opening that penetrates multiple resin insulating layers. Since the opening for the skip via conductor penetrates multiple resin insulating layers, the energy of the laser for forming the opening for the skip via conductor is likely to be larger than the energy of the laser for forming the opening for the via conductor. In the present embodiment, the opening for the skip via conductor reaches the second conductor layer (58A). Therefore, the opening for the skip via conductor may penetrate the second conductor layer (58A). In order to reduce such a risk, in the present embodiment, the thickness (t2) of the second conductor layer (58A) is larger than the thicknesses (t3, t4) of the third conductor layer (58B) and the fourth conductor layer (58C). The opening for the skip via conductor is unlikely to penetrate the second conductor layer (58A). Further, in the present embodiment, the skip via conductor (36C) penetrates the second conductor circuit (58B2) in the third conductor layer (58B). Therefore, the opening for the skip via conductor penetrates the second conductor circuit in the third conductor layer. When the opening for the skip via conductor penetrates the second conductor circuit in the third conductor layer, the energy of the laser is consumed. Therefore, the opening for the skip via conductor is unlikely to penetrate the second conductor layer (58A). According to the printed wiring board of the present embodiment, the skip via conductor reaching the second conductor layer is easily formed. By irradiating laser to the second conductor circuit in the third conductor layer, the opening for the skip via conductor penetrates the second conductor circuit in the third conductor layer. Or, an opening (58O) is formed in the second conductor circuit (58B2) in the third conductor layer. Then, as illustrated in FIG. 5C, due to the opening (58O), the fourth surface (F4) of the second resin insulating layer (50B) is exposed. By irradiating laser to the opening (58O) and to the second conductor circuit (58B2) in the third conductor layer around the opening, the opening for the skip via conductor penetrates the second conductor circuit in the third conductor layer.

Figure 4A:
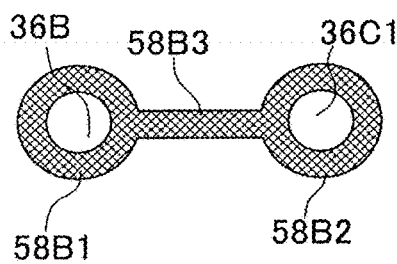
FIG. 4A-4F are plan views of conductor circuits.

FIG. 4A illustrates a plan view of a portion of the third conductor layer (58B). FIG. 4A illustrates the first conductor circuit (58B1) in the third conductor layer (58B), the second conductor circuit (58B2) in the third conductor layer (58B) and the third conductor circuit (58B3) in the third conductor layer (58B). The first conductor circuit (58B1) in the third conductor layer (58B) is formed around the second via conductor (36B) and is directly connected to the second via conductor (36B). The first conductor circuit (58B1) in the third conductor layer (58B) is a land of the second via conductor (36B). The second conductor circuit (58B2) in the third conductor layer (58B) is formed around the first skip via conductor (36C1) and is directly connected to the first skip via conductor (36C1). The second conductor circuit (58B2) is a land (first land) (58B2) of the first skip via conductor (36C1). The first land (58B2) is formed on the fourth surface (F4) of the second resin insulating layer (50B). As illustrated in FIG. 4A, the first conductor circuit (58B1) in the third conductor layer (58B) and the second conductor circuit (58B2) in the third conductor layer (58B) are connected by the third conductor circuit (58B3) in the third conductor layer (58B). These are simultaneously formed.

Figure 4B:
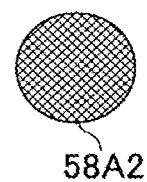
Figure 4C:
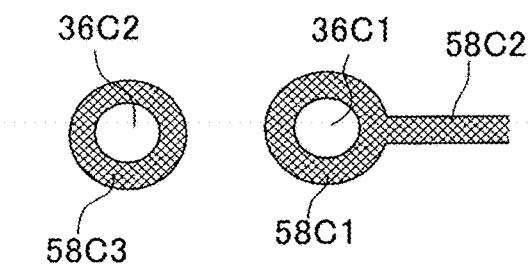
Figure 4D:
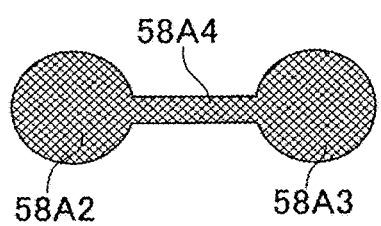
Figure 4E:
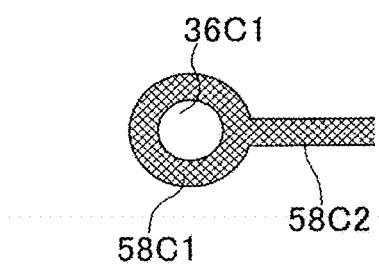

FIG. 4E illustrates a plan view of a portion of the fourth conductor layer (58C). FIG. 4E illustrates the first conductor circuit (58C1) in the fourth conductor layer (58B) and the second conductor circuit (58C2) in the fourth conductor layer (58C). The first conductor circuit (58C1) in the fourth conductor layer (58B) is formed around the first skip via conductor (36C1) and is directly connected to the first skip via conductor (36C1). The first conductor circuit (58C1) is a land (second land) (58C1) of the first skip via conductor (36C1). The second land (58C1) is formed on the sixth surface (F6) of the third resin insulating layer (50C). The second conductor circuit (58C2) is connected to the second land (58C1). The first conductor circuit (58C1) and the second conductor circuit (58C2) are simultaneously formed.

FIG. 4B illustrates a plan view of a portion of the second conductor layer (58A). FIG. 4B illustrates the second conductor circuit (58A2) in the second conductor layer (58A). The first skip via conductor (36C1) is formed directly on the second conductor circuit (58A2) in the second conductor layer (58A). Then, as illustrated in FIG. 4B, the second conductor circuit (58A2) in the second conductor layer (58A) is independent in the second conductor layer. The second conductor circuit (58A2) in the second conductor layer (58A) is a dummy circuit. The second conductor circuit (58A2) in the second conductor layer (58A) is not connected to any other conductor circuit in the second conductor layer (58A). Therefore, data, power and the like are transmitted from the third conductor layer (58B) to the fourth conductor layer (58C) via the first skip via conductor (36C1). Or, data, power and the like are transmitted from the fourth conductor layer (58C) to the third conductor layer (58B) via the first skip via conductor (36C1). However, no data or power is transmitted from the second conductor layer (58A) to the fourth conductor layer (58C) via the first skip via conductor (36C1). No data or power is transmitted from the fourth conductor layer (58C) to the second conductor layer (58A) via the first skip via conductor (36C1). In the printed wiring board 10 of the present embodiment, by having the conductor circuits illustrated in FIGS. 4A, 4B and 4E, data, power and the like in the second conductor layer (58A) pass through the first conductor circuit (58A1) in the second conductor layer (58A) and the second via conductor (36B), and reach the third conductor layer (58B). Then, the data, power and the like reach the first skip via conductor (36C1) via the conductor circuits (58B1, 58B2, 58B3) in the third conductor layer (58B). Thereafter, the data, power and the like reach the conductor circuits (58C1, 58C2) in the fourth conductor layer (58C) via the first skip via conductor (36C1). In the printed wiring board of the present embodiment, even when the skip via conductor is provided, data, power and the like are transmitted to the next conductor layer sequentially. Each of the conductor layers is efficiently used.

The printed wiring board of the present embodiment does not have a via conductor that reaches the third conductor layer (58B). Therefore, the thickness (t3) of the third conductor layer (58B) may be small. Therefore, the thickness of the printed wiring board 10 can be reduced.

Figure 1B:
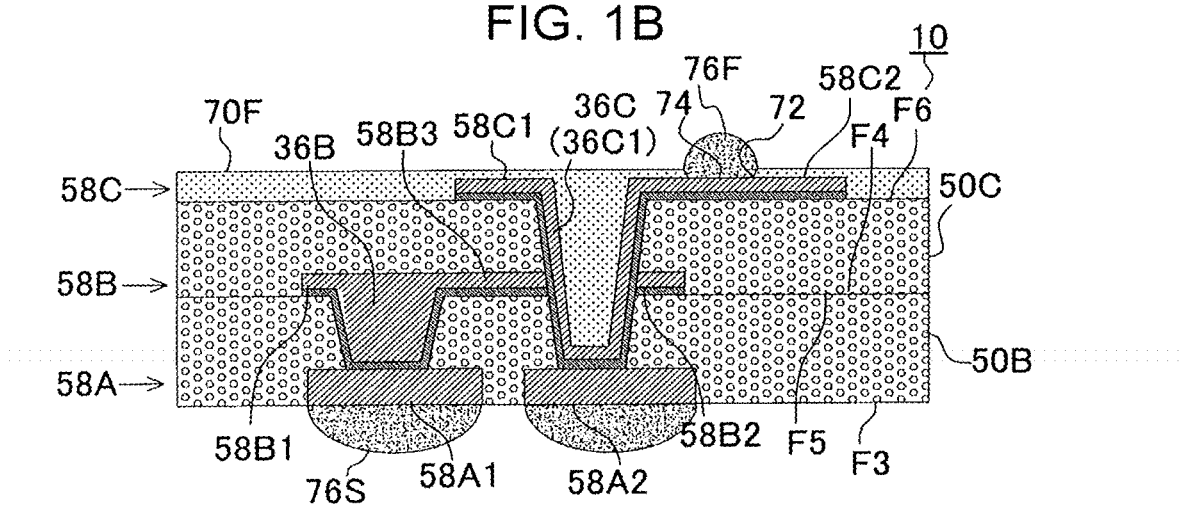

As illustrated in FIG. 1B, the printed wiring board 10 of the present embodiment may have a solder resist layer (70F) on the third resin insulating layer (50C) and on the fourth conductor layer (58C). The solder resist layer (70F) has an opening 72 that exposes a pad 74 included in the fourth conductor layer (58C). A solder bump (76F) is formed on the pad 74 (FIG. 1B). An electronic component such as an IC chip (not illustrated in the drawings) is mounted on the printed wiring board 10 via the solder bump (76F).

Second Embodiment

Figure 1C:
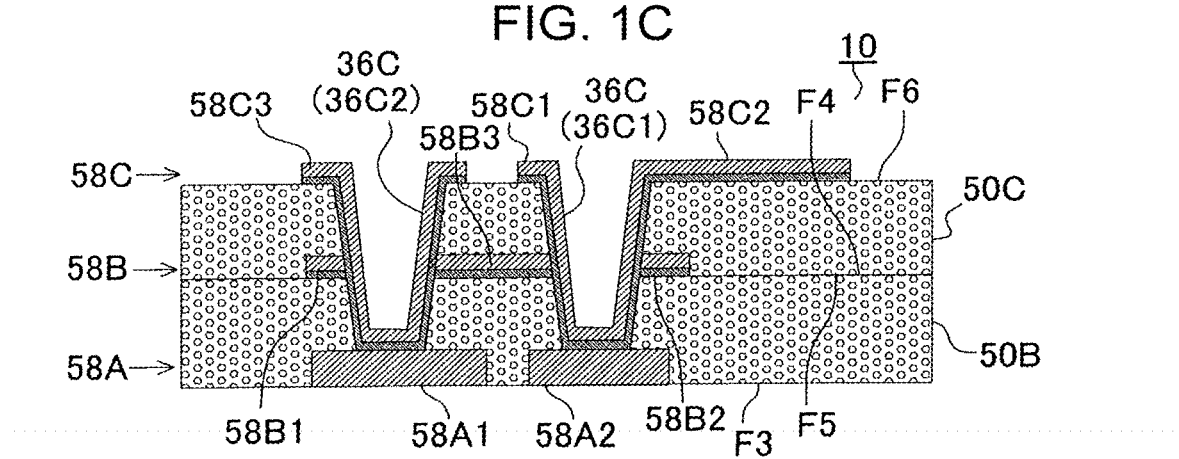
FIG. 1C is a cross-sectional view of a printed wiring board according to a second embodiment of the present invention.

FIG. 1C illustrates a cross-sectional view of a printed wiring board 10 of a second embodiment. FIG. 4C illustrates a plan view of a portion of the fourth conductor layer (58C) of the second embodiment. As illustrated in FIGS. 1C and 4C, in the second embodiment, a second skip via conductor (36C2) and a third conductor circuit (58C3) in the fourth conductor layer (58C) are added to the printed wiring board of the first embodiment. And, the second via conductor (36B) does not exist. Or, a portion of the second skip via conductor can be considered as the second via conductor.

The second skip via conductor (36C2) penetrates the third resin insulating layer (50C), the first conductor circuit (58B1) in the third conductor layer (58B), and the second resin insulating layer (50B), and reaches the first conductor circuit (58A1) in the second conductor layer (58A).

The third conductor circuit (58C3) in the fourth conductor layer (58C) is formed around the second skip via conductor (36C2) and is directly connected to the second skip via conductor (36C2). The third conductor circuit (58C3) is a land (fourth land) (58C3) of the second skip via conductor (36C2). The land (58C3) of the second skip via conductor (36C2) is a dummy circuit. The land (58C3) of the second skip via conductor (36C2) is not connected to any other conductor circuit in the fourth conductor layer (58C).

The first conductor circuit (58B1) in the third conductor layer (58B) is formed around the second skip via conductor (36C2) and is directly connected to the second skip via conductor (36C2). The first conductor circuit (58B1) is a land (third land) (58B1) of the second skip via conductor (36C2). The land (58B1) of the second skip via conductor (36C2) is connected to the land (58B2) of the first skip via conductor (36C1) via the third conductor circuit (58B3) in the third conductor layer (58B).

The first conductor circuit (58A1) in the second conductor layer (58A) and the first conductor circuit (58B1) in the third conductor layer (58B) are connected to each other via the second skip via conductor (36C2). Therefore, data, power and the like are transmitted from the second conductor layer (58A) to the third conductor layer (58B) via the second skip via conductor (36C2). Or, data, power and the like are transmitted from the third conductor layer (58B) to the second conductor layer (58A) via the second skip via conductor (36C2). For example, data, power and the like are transmitted from the first conductor circuit (58A1) in the second conductor layer (58A) to the first conductor circuit (58B1) in the third conductor layer (58B) via the second skip via conductor (36C2). Thereafter, similar to the first embodiment, the data, power and the like reach the first skip via conductor (36C1). Thereafter, the data, power and the like reach conductor circuits (58C1, 58C2) in the fourth conductor layer (58C) via the first skip via conductor (36C1). In the second embodiment, a via conductor that penetrates only one resin insulating layer is not provided. Or, the number of via conductors that penetrate only one resin insulating layer is reduced. A high density printed wiring board can be provided. A process is simplified.

Third Embodiment

Figure 4F:
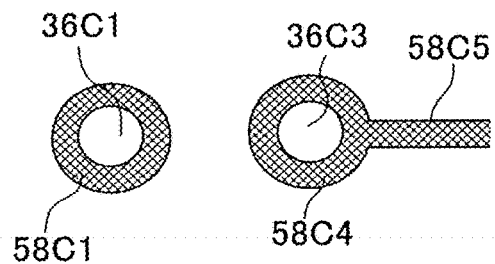
Figure 5A:
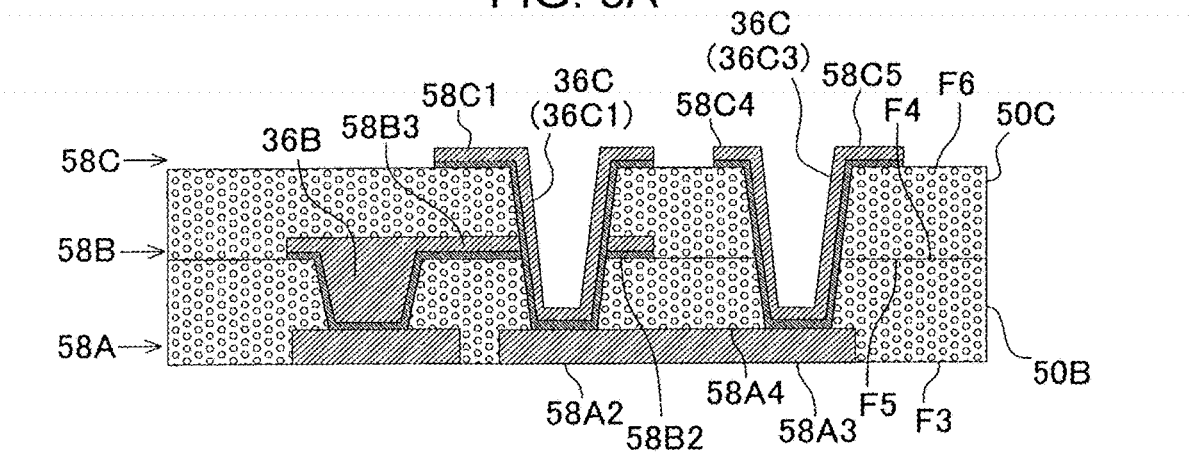
FIG. 5A is a cross-sectional view of a printed wiring board according to a third embodiment of the present invention.

FIG. 5A illustrates a cross-sectional view of a third embodiment. FIG. 4D illustrates a portion of the second conductor layer (58A). FIG. 4F illustrates a portion of the fourth conductor layer (58C). In the third embodiment, a third skip via conductor (36C3), a third conductor circuit (58A3) in the second conductor layer (58A), a fourth conductor circuit (58A4) in the second conductor layer (58A), a fourth conductor circuit (58C4) in the fourth conductor layer (58C), and a fifth conductor circuit (58C5) in the fourth conductor layer (58C) are added to the printed wiring board of the first embodiment. As illustrated in FIGS. 5A and 4F, the first conductor circuit (58C1) in the fourth conductor layer (58C) of the third embodiment is a land (58C1) of the first skip via conductor (36C1). In the third embodiment, the land (58C1) of the first skip via conductor (36C1) is a dummy circuit. The land (58C1) of the first skip via conductor of the third embodiment is independent in the fourth conductor layer (58C) and is not connected to any other conductor circuit in the fourth conductor layer (58C).

As illustrated in FIG. 5A, the second conductor circuit (58A2) in the second conductor layer (58A) is directly connected to the first skip via conductor (36C1). The first skip via conductor (36C1) is formed directly on the second conductor circuit (58A2) in the second conductor layer (58A). And, as illustrated in FIG. 4D, the second conductor circuit (58A2) in the second conductor layer (58A) is connected to the third conductor circuit (58A3) in the second conductor layer (58A) via the fourth conductor circuit (58A4) in the second conductor layer (58A). And, as illustrated in FIG. 5A, the third skip via conductor (36C3) is connected directly on the third conductor circuit (58A3) in the second conductor layer (58A). The third conductor circuit (58A3) in the second conductor layer (58A) and the fourth conductor circuit (58C4) in the fourth conductor layer (58C) are connected to each other via the third skip via conductor (36C3). The fourth conductor circuit (58C4) in the fourth conductor layer (58C) is a land (58C4) of the third skip via conductor (36C3). The land (58C4) is formed around the third skip via conductor (36C) and is directly connected to the third skip via conductor (36C). The fifth conductor circuit (58C5) in the fourth conductor layer (58C) extends from the fourth conductor circuit (58C4). As illustrated in FIG. 5A, the third skip via conductor (36C3) does not have a land included in the third conductor layer. However, it is also possible that the third skip via conductor (36C3) has a land (conductor circuit in the third conductor layer (58B)) that is independent in the third conductor layer (58B).

Data, power and the like reach the third conductor layer (58B) from the second conductor layer (58A) via the second via conductor (36B). Thereafter, the data, power and the like are transmitted from the third conductor layer (58B) to the second conductor layer (58C) via the first skip via conductor (36C1). Thereafter, the data, power and the like are transmitted from the second conductor layer (58A) to the fourth conductor layer (58C) via the third skip via conductor (36C3). In the third embodiment, data, power and the like are transmitted to an adjacent conductor layer via the skip via conductors. Further, according to the third embodiment, due to the skip via conductors, data, power and the like can be transmitted to a conductor layer other than an adjacent conductor layer. In the third embodiment, complicated transmission is possible. A sophisticated electronic component can be mounted on the printed wiring board.

Fourth Embodiment

Figure 5B:
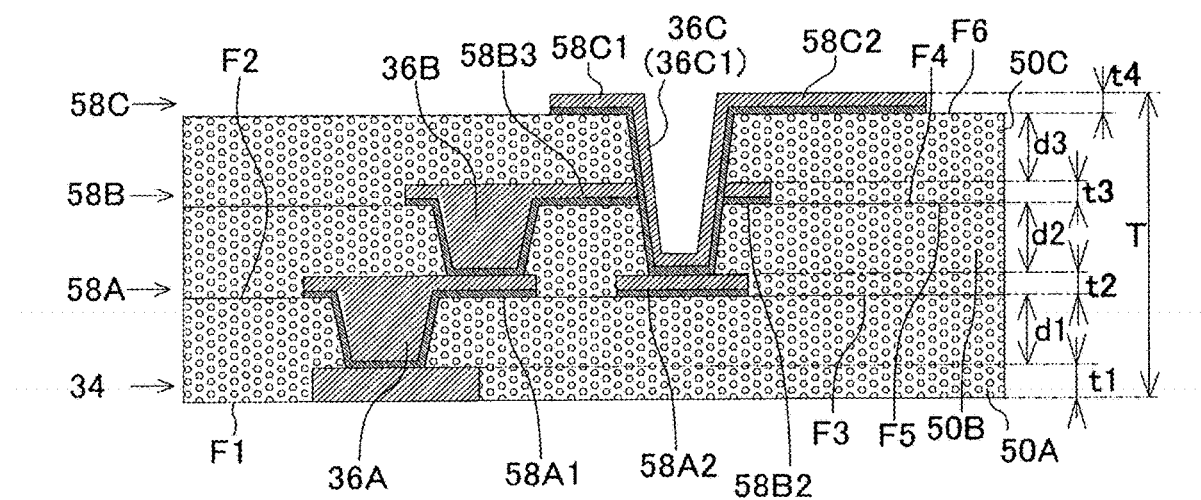
FIG. 5B is a cross-sectional view of a printed wiring board according to a fourth embodiment of the present invention.
Figure 5C:
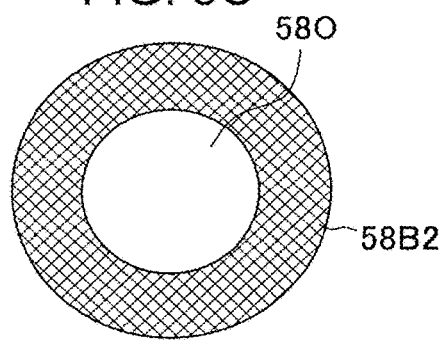
FIG. 5C illustrates an opening and a second conductor circuit in a third conductor layer around the opening.

FIG. 5B illustrates a cross-sectional view of a printed wiring board 10 of a fourth embodiment. In the printed wiring board 10 of the fourth embodiment, a first conductor layer 34 and a first resin insulating layer (50A) on the first conductor layer 34 are added to the printed wiring board 10 of the first embodiment. The first resin insulating layer (50A) has a first surface (F1) and a second surface (F2) that is on an opposite side of the first surface. The first resin insulating layer (50A) is formed below the second resin insulating layer (50B) and the second conductor layer (58A) such that the second surface (F2) and the third surface (F3) oppose each other. The second resin insulating layer (50B) is formed on the first resin insulating layer (50A) and the second conductor layer (58A). The first conductor layer 34 and the second conductor layer (58A) are connected to each other by a first via conductor (36A) that penetrates the first resin insulating layer (50A). A thickness (t1) of the first conductor layer 34 is 3.5 μm or more and 6.5 μm or less. Even when an opening for the first via conductor (36A) that penetrates the first resin insulating layer and reaches the first conductor layer 34 is formed using laser, since the first conductor layer 34 has the same thickness as the second conductor layer (58A), laser is unlikely to penetrate the first conductor layer.

A thickness (d1) of the first resin insulating layer (50A) is a distance between the first conductor layer 34 and the second conductor layer (58A), and is 4 μm or more and 6 μm or less. In the fourth embodiment, the thickness (t1) is 5 μm and the thickness (d1) is 5 μm. The thickness (t1) and the thickness (t2) are substantially equal to each other. The thickness (t1) is larger than the thickness (t3) and the thickness (t4). The thickness (d1), the thickness (d2) and the thickness (d3) are substantially equal to each other.

The printed wiring board 10 of the fourth embodiment is formed by adding the first conductor layer 34, the first resin insulating layer (50A) and the first via conductor (36A) to the printed wiring board 10 of the first embodiment. According to the fourth embodiment, a sophisticated electronic component can be mounted on the printed wiring board.

Fifth Embodiment

Figure 6A:
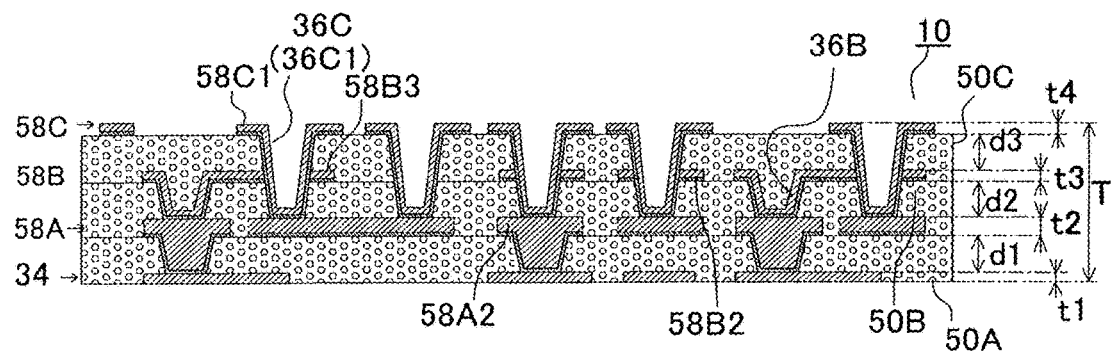
FIG. 6A is a cross-sectional view of a printed wiring board according to a fifth embodiment of the present invention.

FIG. 6A illustrates a cross-sectional view of a printed wiring board 10 of a fifth embodiment. The printed wiring board 10 of the fifth embodiment is the same as the printed wiring board 10 of the fourth embodiment except for the thickness (t1) of the first conductor layer 34. In the printed wiring board 10 of the fifth embodiment, the thickness (t1) of the first conductor layer 34 and the thicknesses (t3, t4) are substantially equal to each other, and the thickness (t1) is smaller than the thickness (t2). The thicknesses (t1, t3, t4) are each 1 μm or more and 4 μm or less, and the thickness (t2) is 3.5 μm or more and 6.5 μm or less. Since the thickness (t1) of the printed wiring board of the fifth embodiment is smaller than the thickness (t1) of the printed wiring board of the fourth embodiment, the thickness (T) of the printed wiring board of the fifth embodiment is smaller than the thickness (T) of the printed wiring board of the fourth embodiment. In the printed wiring board of the fifth embodiment, an opening for a skip via conductor that reaches the first conductor layer 34 is not formed. Therefore, even when an opening for a via conductor is formed using laser, the opening is unlikely to penetrate the first conductor layer. In the fourth embodiment or the fifth embodiment, the first via conductor (36A) penetrates only the first resin insulating layer (50A). And, a skip via conductor is not formed in the first resin insulating layer (50A).

It is preferable that an opening for a skip via conductor reach a thick conductor layer. It is preferable that an opening for a via conductor (opening that penetrates only one resin insulating layer) reach a thin conductor layer.

According to the present embodiment, a thin printed wiring board can be provided. Reliability of connection via the via conductor or the skip via conductor can be increased.

Figure 2A:
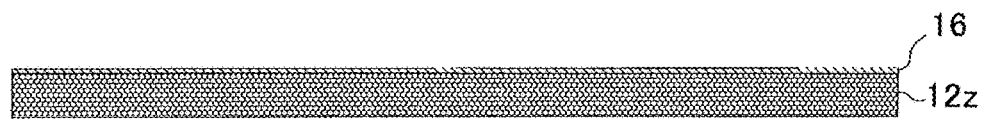
FIG. 2A-2D illustrate manufacturing process diagrams of a printed wiring board of an embodiment.

Method for Manufacturing Printed Wiring Board of Fourth Embodiment or Fifth Embodiment FIGS. 2A-2D and 3A-3C illustrate a method for manufacturing the printed wiring board of the fourth embodiment or the fifth embodiment. As illustrated in FIG. 2A, a support plate (12z) is prepared.

Figure 2B:
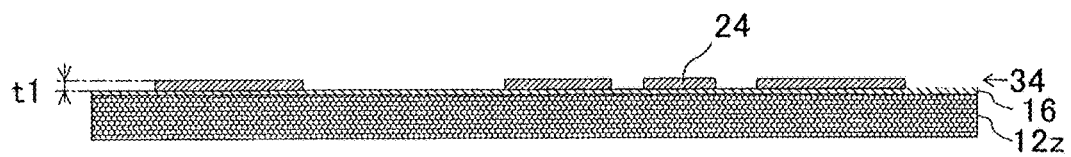
Figure 2C:
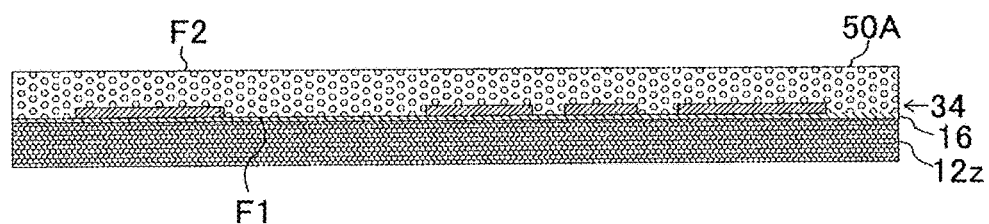

An example of the support plate is a double-sided copper-clad laminated plate. A copper foil 16 is laminated on the support plate (12z) (FIG. 2A). A plating resist is formed on the copper foil 16. An electrolytic copper plating film 24 is formed by electrolytic copper plating on the copper foil 16 that is exposed from the plating resist. The plating resist is removed. The first conductor layer 34 is formed from the electrolytic copper plating film 24 (FIG. 2B). The thickness (t1) of the first conductor layer 34 is 1 μm or more and 4 μm or less. Or, the thickness (t1) of the first conductor layer 34 is 3.5 μm or more and 6.5 μm or less. The thickness (t1) of the first conductor layer 34 in FIG. 2B is 1 μm or more and 4 μm or less. An example of the thickness (t1) is 2.5 μm. The first resin insulating layer (50A) is formed on the first conductor layer 34 and the copper foil 16 (FIG. 2C). The first conductor layer 34 is embedded on the first surface (F1) side of the first resin insulating layer (50A).

Figure 2D:
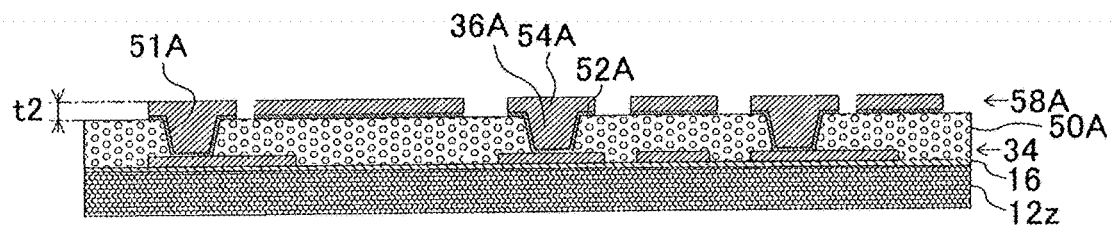
Figure 6B:
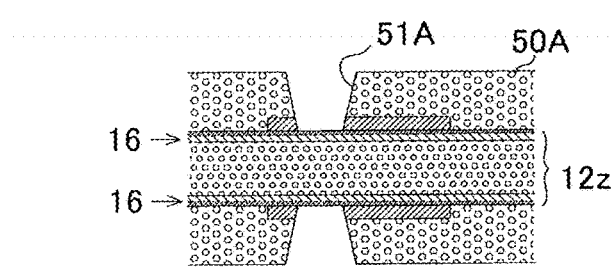
FIG. 6B-6D are explanatory diagrams of via conductors.
Figure 6C:
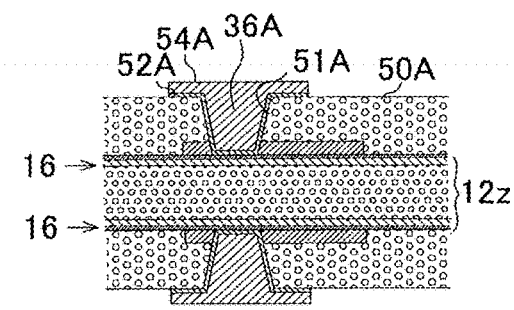

The opening (51A) for the first via conductor that penetrates the first resin insulating layer (50A) and reaches the first conductor layer 34 is formed using laser (FIG. 2D). The thickness (t1) of the first conductor layer 34 is small. However, the first conductor layer 34 is formed on the copper foil 16. Therefore, since heat is released via the copper foil 16, laser is unlikely to penetrate the first conductor layer 34. Even when laser penetrates the first conductor layer 34, laser stops at the copper foil 16. An example of this case is illustrated in FIG. 6B. The opening (51A) illustrated in FIG. 6B penetrates the first resin insulating layer (50A) and the first conductor layer 34. A seed layer (52A) such as an electroless copper plating film is formed on the second surface (F2) of the first resin insulating layer (50A) and in the opening (51A) for the first via conductor. As illustrated in FIG. 6B, even when the opening (51A) penetrates the first conductor layer 34, the opening (51A) is closed by the copper foil 16. Since the seed layer (52A) is formed on the copper foil 16 that is exposed by the opening (51A), a bottom of the opening (51A) is closed by the seed layer (52A). The bottom of the opening (51A) is positioned on the copper foil 16. Thereafter, a plating resist is formed on the seed layer (52A). An electrolytic plating film (54A) is formed from copper or the like on the seed layer that is exposed from the plating resist. The opening (51A) for the first via conductor is filled with the electrolytic plating film (54A). The first via conductor (36A) is formed from a filled via conductor in the opening (51A) (FIG. 2D). As illustrated in FIG. 6B, even when the opening (51A) penetrates the first conductor layer 34, since the bottom of the opening (51A) is closed by the seed layer (52A), the first via conductor can be formed from the seed layer (52A) and the electrolytic plating film (54A) in the opening (51A) (FIG. 6C). The plating resist is removed. The seed layer (52A) exposed from the electrolytic plating film (54A) is removed, and the second conductor layer (58A) is formed (FIG. 2D). The thickness (t2) of the second conductor layer (58A) is 5 μm.

The first via conductor (36A) formed in the opening (51A) of FIG. 6B is illustrated in FIG. 6C. The first via conductor (36A) of FIG. 2D reaches the first conductor layer 34. In contrast, the first via conductor (36A) of FIG. 6C penetrates the first resin insulating layer (50A) and the first conductor layer 34. And, the first via conductor (36A) of FIG. 6C reaches the copper foil 16. The first via conductor (36A) and the first conductor layer 34 in FIG. 6C are connected to each other by a side wall of the first conductor layer exposed from the opening (51A) and a side wall of the first via conductor (36A).

Figure 3A:
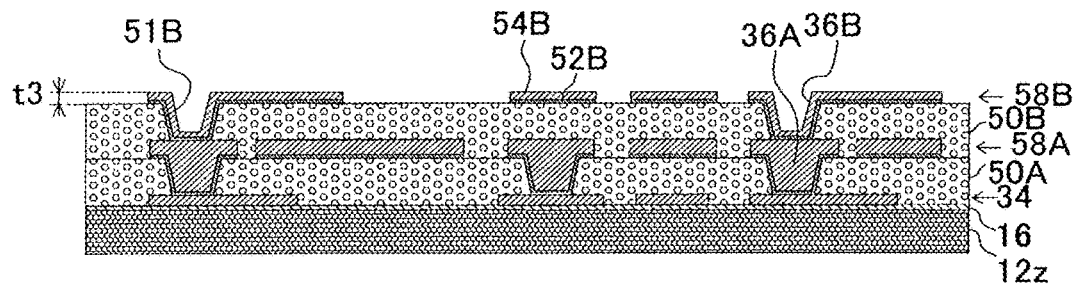
FIG. 3A-3C illustrate manufacturing process diagrams of the printed wiring board of the embodiment.

The second resin insulating layer (50B) is formed on the first resin insulating layer (50A) and the second conductor layer (58A). An opening (51B) for the second via conductor that reaches the second conductor layer (58A) is formed in the second resin insulating layer (50B) using laser (FIG. 3A). Since the thickness (t2) (5 μm) of the second conductor layer (58A) is large, laser is unlikely to penetrate the second conductor layer (58A). The third conductor layer (58B) and the second via conductor (36B), which include an electroless plating film (52B) and an electrolytic plating film (54B), are formed using a semi-additive method (FIG. 3A). The thickness (t3) of the third conductor layer (58B) is 2.5 μm.

The third resin insulating layer (50C) is formed on the second resin insulating layer (50B) and the third conductor layer (58B). Openings (51C1, 51C2, 51C3) for the skip via conductors that penetrate the third resin insulating layer (50C) and the second resin insulating layer (50B) and reach the second conductor layer (58A) are formed using laser. The openings for the skip via conductors may penetrate the third conductor layer. Since the thickness (t3) of the third conductor layer (58B) is small, laser can penetrate the third conductor layer (58B). In contrast, since the thickness (t2) of the second conductor layer (58A) is large, laser is unlikely to penetrate the second conductor layer (58A). When laser penetrates the third conductor layer, the energy of the laser is consumed. Therefore, the laser is unlikely to penetrate the second conductor layer.

Figure 3B:
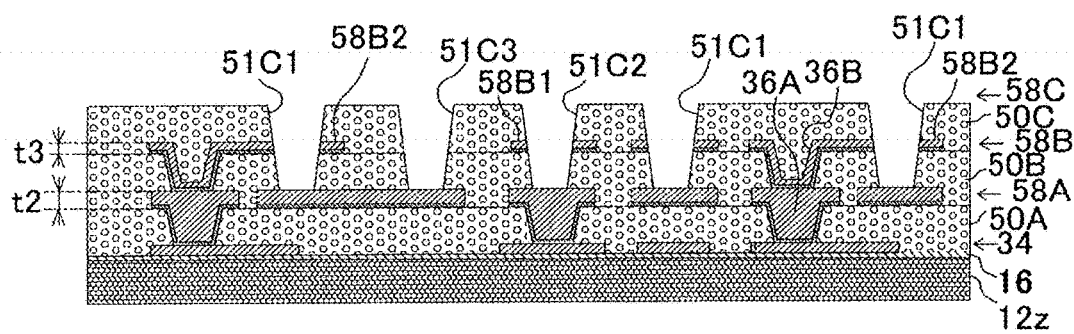

The opening (51C1) for the first skip via conductor (36C1) penetrates the second conductor circuit (58B2) in the third conductor layer (58B). The opening (51C2) for the second skip via conductor (36C2) further penetrates the first conductor circuit (58B1) in the third conductor layer (58B). It is possible that the opening (51C3) for the third skip via conductor (36C3) penetrates or does not penetrate a conductor circuit in the third conductor layer (58B). In FIG. 3B, the opening (51C3) does not penetrate the third conductor layer.

Figure 3C:
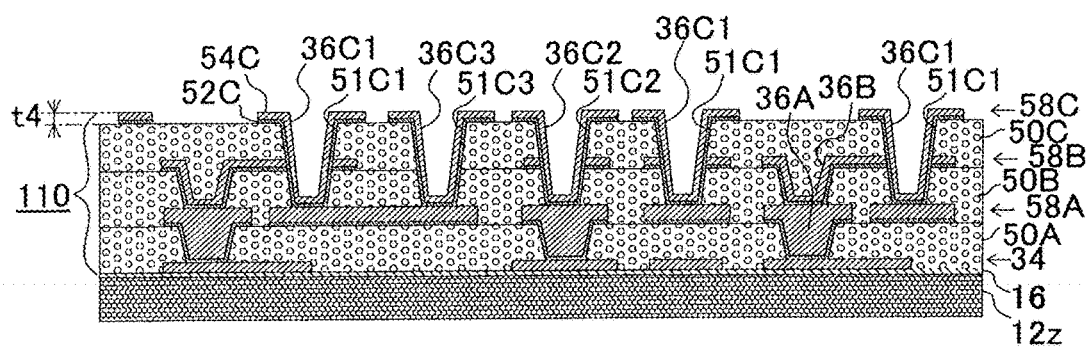

The fourth conductor layer (58C) and the skip via conductors (36C1, 36C2, 36C3), which include an electroless plating film (52C) and an electrolytic plating film (54C), are formed using a semi-additive method (FIG. 3C). The thickness (t4) of the fourth conductor layer (58C) is 2.5 μm. An intermediate substrate 110, which includes the resin insulating layers (50A, 50B, 50C), the conductor layers (34, 58A, 58B, 58C), the via conductors (36A, 36B) and the skip via conductors (36C1, 36C2, 36C3), is formed on the copper foil 16. Among the skip via conductors (36C1, 36C2, 36C3), it is also possible that the intermediate substrate 110 has only the first skip via conductor (36C1). Among the skip via conductors (36C1, 36C2, 36C3), it is also possible that the intermediate substrate 110 has only the first skip via conductor (36C1) and the second skip via conductor (36C2). Among the skip via conductors (36C1, 36C2, 36C3), it is also possible that the intermediate substrate 110 has only the first skip via conductor (36C1) and the third skip via conductor (36C3).

Figure 6D:
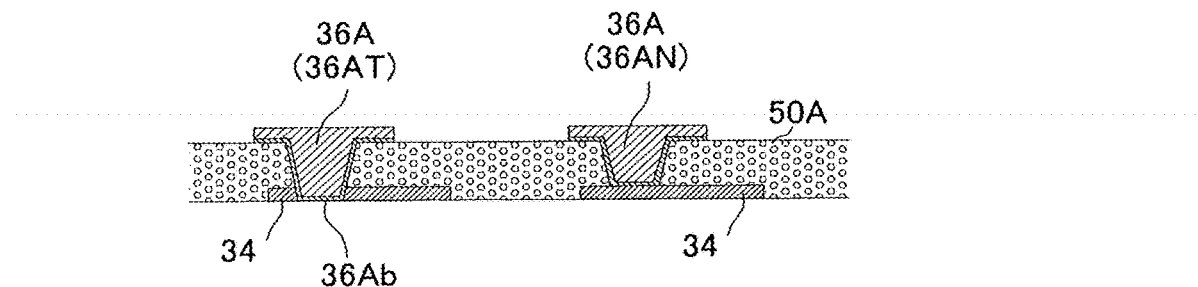

The intermediate substrate 110 and the copper foil 16 are separated from the support plate (12z). The copper foil 16 is bonded to the intermediate substrate 110. The copper foil 16 is removed from the intermediate substrate 110 by etching or the like. The first conductor layer 34 is exposed. The printed wiring board 10 is formed (FIG. 6A). When the intermediate substrate 110 has the first via conductor (36A) of FIG. 6C, as illustrated in FIG. 6D, by removing the copper foil 16, a bottom (36Ab) of a first via conductor (36AT) is exposed. As illustrated in FIG. 6D, the printed wiring board 10 may have both a first via conductor (36AN) that reaches the first conductor layer 34 and the first via conductor (36AT) that penetrates the first conductor layer 34. Or, all first via conductors (36A) may be formed as first via conductors (36AT) that penetrate the first conductor layer 34. When the printed wiring board 10 has the first via conductor (36AT), data, power and the like are directly transmitted from an external motherboard or electronic component or the like to the first via conductor (36AT). Or, data, power and the like are directly transmitted from the first via conductor (36AT) to the external motherboard or electronic component or the like. Transmission loss is reduced.

As illustrated in FIG. 1B, the solder resist layer (70F) having the opening 72 that exposes the fourth conductor layer (58C) can be formed on the third resin insulating layer (50C) and the fourth conductor layer (58C) of the printed wiring board 10. The fourth conductor layer (58C) exposed by the opening 72 functions as the pad 74. As illustrated in FIG. 1B, the solder bump (76F) can be formed on the pad 74. A solder bump (76S) can be formed on the first conductor layer 34 exposed from the first surface (F1) of the first resin insulating layer (50A). A solder bump (76S) can be formed on the bottom (36Ab) of the first via conductor (36AT) that penetrates the first conductor layer 34.

Method for Manufacturing Printed Wiring Board of First, Second or Third Embodiment In the process of FIG. 2B, the second conductor layer (58A) is formed on the copper foil 16. The thickness (t2) of the second conductor layer (58A) is 3.5 μm or more and 6.5 μm or less. For example, the thickness (t2) is 5 μm. Thereafter, using the same method as FIG. 2C, the second resin insulating layer (50B) is formed on the copper foil 16 and the second conductor layer (58A). Thereafter, using the same method as that illustrated in FIG. 3A, the third conductor layer (58B) and the second via conductor (36B) are formed. The same method as that illustrated in FIGS. 3B and 3C is performed. The third resin insulating layer (50C) is formed on the second resin insulating layer (50B) and the third conductor layer (58B). The fourth conductor layer (58C) is formed on the third resin insulating layer (50C). The skip via conductors (36C1, 36C2, 36C3) are formed. An intermediate substrate 110, which includes the resin insulating layers (50B, 50C), the conductor layers (58A, 58B, 58C), the via conductor (36B) and the skip via conductors (36C1, 36C2, 36C3), is formed on the copper foil 16. It is also possible that the intermediate substrate 110 has only the first skip via conductor (36C1). It is also possible that the intermediate substrate 110 has only the first skip via conductor (36C1) and the second skip via conductor (36C2). It is also possible that the intermediate substrate 110 has only the first skip via conductor (36C1) and the third skip via conductor (36C3). Thereafter, the intermediate substrate 110 and the copper foil 16 are separated from the support plate (12z). The copper foil 16 is bonded to the intermediate substrate 110. The copper foil 16 is removed from the intermediate substrate 110 by etching or the like. The second conductor layer (58A) is exposed. The printed wiring board 10 illustrated in FIG. 1A is formed. Or the printed wiring board 10 illustrated in FIG. 1C is formed. Or the printed wiring board 10 illustrated in FIG. 5A is formed.

The number of the resin insulating layers and the number of the conductor layers are not limited.

Japanese Patent Laid-Open Publication No. 2007-115954 illustrates a multilayer printed wiring board having a via that penetrates one insulating layer and a skip via that penetrates multiple insulating layers. According to Japanese Patent Laid-Open Publication No. 2007-11595, by adjusting a condition of laser, an opening for a skip via reaching a wiring is formed using laser. In Japanese Patent Laid-Open Publication No. 2007-11595, a depth of the skip via is larger than a depth of the via that penetrates one insulating layer. Therefore, by adjusting only the condition of laser, it is likely to be difficult to increase both reliability of connection via the skip via and reliability of connection via the via that penetrates one insulating layer.

A printed wiring board according to an embodiment of the present invention includes: a second conductor layer; a second resin insulating layer on the second conductor layer; a third conductor layer on the second resin insulating layer; a third resin insulating layer on the second resin insulating layer and the third conductor layer; a fourth conductor layer on the third resin insulating layer; a second via conductor that penetrates the second resin insulating layer, and connects a first conductor circuit in the second conductor layer and a first conductor circuit in the third conductor layer; and a first skip via conductor that penetrates the third resin insulating layer, a second conductor circuit in the third conductor layer, and the second resin insulating layer, and connects a second conductor circuit in the second conductor layer and a first conductor circuit in the fourth conductor layer. A thickness (t2) of the second conductor layer is larger than a thickness (t3) of the third conductor layer.

According to an embodiment of the present invention, both reliability of connection via the via conductor that penetrates one resin insulating layer and reliability of connection via the skip via conductor that penetrates multiple resin insulating layers can be increased. A process is simplified. A thickness of the printed wiring board can be reduced. Even when thicknesses of the resin insulating layers are small, a printed wiring board having high insulation reliability can be provided.

Obviously, numerous modifications and variations of the present invention are possible in light of the above teachings. It is therefore to be understood that within the scope of the appended claims, the invention may be practiced otherwise than as specifically described herein.

What is claimed is:

1. A printed wiring board, comprising:
    a first conductor layer;
    a first resin insulating layer formed on the first conductor layer;
    a second conductor layer formed on the first resin insulating layer and including a first conductor circuit and a second conductor circuit;
    a second resin insulating layer formed on the first resin insulating layer such that the second resin insulating layer is covering the second conductor layer;
    a third conductor layer formed on the second resin insulating layer and including a first conductor circuit and a second conductor circuit;
    a third resin insulating layer formed on the second resin insulating layer such that the third resin insulating layer is covering the third conductor layer;
    a fourth conductor layer formed on the third resin insulating layer and including a first conductor circuit;
    a first via conductor formed through the first resin insulating layer such that the first via conductor is connecting the first and second conductor layers;
    a second via conductor formed in a second via opening extending through the second resin insulating layer such that the second via conductor is connecting the first conductor circuits in the second conductor layer and the third conductor layer; and
    a first skip via conductor formed in a first skip via opening extending through the second and third resin insulating layers such that the first skip via conductor is penetrating through the second conductor circuit in the third conductor layer and connecting the second conductor circuit in the second conductor layer and the first conductor circuit in the fourth conductor layer,
    wherein the second and third conductor layers are formed such that the second conductor layer has a thickness t2 which is larger than a thickness t3 of the third conductor layer, and the second conductor circuit in the second conductor layer is a dummy circuit structure formed such that the second conductor circuit in the second conductor layer is not connected to other conductor circuits in the second conductor layer and is not connected to the first conductor layer.

2. A printed wiring board according to claim 1, wherein the third conductor layer includes a third conductor circuit such that the third conductor circuit in the third conductor layer is connecting the first and second conductor circuits in the third conductor layer.

3. A printed wiring board according to claim 2, wherein the first, second and third conductor circuits in the third conductor layer comprise a conductor layer structure formed in a same process.

4. A printed wiring board according to claim 2, wherein the first, second and third conductor circuits in the third conductor layer comprise an integral conductor layer structure.

5. A printed wiring board according to claim 2, wherein the second and fourth conductor layers are formed such that the second conductor layer has the thickness t2 which is larger than a thickness t4 of the fourth conductor layer.

6. A printed wiring board according to claim 5, wherein the first and second conductor layers are formed such that the second conductor layer has the thickness t2 which is larger than a thickness t1 of the first conductor layer.

7. A printed wiring board according to claim 1, wherein the first and second conductor circuits in the third conductor layer comprise an integral conductor layer structure.

8. A printed wiring board according to claim 7, wherein the third resin insulating layer has no via conductor formed through only the third resin insulating layer and connecting the third and fourth conductor layers.

9. A printed wiring board according to claim 7, wherein the second and fourth conductor layers are formed such that the second conductor layer has the thickness t2 which is larger than a thickness t4 of the fourth conductor layer.

10. A printed wiring board according to claim 1, wherein the fourth conductor layer includes a third conductor circuit, and the second via conductor is formed through the second and third resin insulating layers such that the second via conductor forms a portion of a second skip via conductor connecting the first conductor circuit in the second conductor layer and the third conductor circuit in the fourth conductor layer.

11. A printed wiring board according to claim 1, further comprising:
    a third skip via conductor formed through the second and third resin insulating layers such that the third skip via conductor is connecting the second and fourth conductor layers.

12. A printed wiring board according to claim 1, wherein the third resin insulating layer has no via conductor formed through only the third resin insulating layer and connecting the third and fourth conductor layers.

13. A printed wiring board according to claim 12, wherein the second and fourth conductor layers are formed such that the second conductor layer has the thickness t2 which is larger than a thickness t4 of the fourth conductor layer.

14. A printed wiring board according to claim 13, wherein the first and second conductor layers are formed such that the second conductor layer has the thickness t2 which is larger than a thickness t1 of the first conductor layer.

15. A printed wiring board according to claim 12, wherein the second conductor layer is formed such that the second conductor layer has the thickness t2 in a range of from 3.5 μm to 6.5 μm, and the third conductor layer is formed such that the third conductor layer has the thickness t3 in a range of from 1 μm to 4 μm.

16. A printed wiring board according to claim 12, wherein the second and third conductor layers are formed such that a ratio t2/t3 is in a range of from 1.5 to 2.5 where t2 is the thickness of the second conductor layer, and t3 is the thickness of the third conductor layer.

17. A printed wiring board according to claim 1, wherein the second and fourth conductor layers are formed such that the second conductor layer has the thickness t2 which is larger than a thickness t4 of the fourth conductor layer.

18. A printed wiring board according to claim 17, wherein the second conductor layer is formed such that the second conductor layer has the thickness t2 in a range of from 3.5 μm to 6.5 μm, and the third conductor layer is formed such that the third conductor layer has the thickness t3 in a range of from 1 μm to 4 μm.

19. A printed wiring board according to claim 1, wherein the second conductor layer is formed such that the second conductor layer has the thickness t2 in a range of from 3.5 μm to 6.5 μm, and the third conductor layer is formed such that the third conductor layer has the thickness t3 in a range of from 1 μm to 4 μm.

20. A printed wiring board according to claim 1, wherein the second and third conductor layers are formed such that a ratio t2/t3 is in a range of from 1.5 to 2.5 where t2 is the thickness of the second conductor layer, and t3 is the thickness of the third conductor layer.

* * * * *